United States Patent
Beitel et al.

(10) Patent No.: US 9,800,053 B2
(45) Date of Patent: Oct. 24, 2017

(54) SOLAR PANELS WITH INTEGRATED CELL-LEVEL MPPT DEVICES

(75) Inventors: Christopher James Beitel, Los Altos, CA (US); Jiunn Benjamin Heng, San Jose, CA (US); Jianming Fu, Palo Alto, CA (US); Zheng Xu, Pleasanton, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 13/252,987

(22) Filed: Oct. 4, 2011

(65) Prior Publication Data

US 2012/0085384 A1    Apr. 12, 2012

Related U.S. Application Data

(60) Provisional application No. 61/391,460, filed on Oct. 8, 2010.

(51) Int. Cl.
| | |
|---|---|
| *H01L 31/042* | (2014.01) |
| *H02J 3/38* | (2006.01) |
| *H01L 31/048* | (2014.01) |
| *H02S 40/32* | (2014.01) |

(52) U.S. Cl.
CPC ............ *H02J 3/385* (2013.01); *H01L 31/048* (2013.01); *H02S 40/32* (2014.12); *Y02E 10/58* (2013.01)

(58) Field of Classification Search
CPC ............... H01L 31/042; H01L 31/0428; H01L 31/0443; G05F 1/67; Y02E 10/58
USPC ......................................................... 136/244
See application file for complete search history.

(56) References Cited

U.S. PATENT DOCUMENTS

| | | |
|---|---|---|
| 819,360 A | 3/1902 | Mayer |
| 2,626,907 A | 1/1953 | De Groote |
| 2,938,938 A | 5/1960 | Dickson |
| 3,094,439 A | 6/1963 | Mann |
| 3,116,171 A | 12/1963 | Nielson |
| 3,459,597 A | 8/1969 | Baron |
| 3,961,997 A | 6/1976 | Chu |
| 3,969,163 A | 7/1976 | Wakefield |
| 4,015,280 A | 3/1977 | Matsushita |
| 4,082,568 A | 4/1978 | Lindmayer |
| 4,124,410 A | 11/1978 | Kotval |

(Continued)

FOREIGN PATENT DOCUMENTS

| | | |
|---|---|---|
| CN | 101553933 | 10/2009 |
| CN | 100580957 C | 1/2010 |

(Continued)

OTHER PUBLICATIONS

Chabal, Yves J. et al., 'Silicon Surface and Interface Issues for Nanoelectronics,' The Electrochemical Society Interface, Spring 2005, pp. 31-33.

(Continued)

*Primary Examiner* — James Lin
*Assistant Examiner* — Dujuan Horton
(74) *Attorney, Agent, or Firm* — Shun Yao; Park, Vaughan, Fleming & Dowler LLP

(57) ABSTRACT

One embodiment of the present invention provides a solar cell panel that includes a front-side cover, a back-side cover, a number of solar cells situated between the front-side cover and the back-side cover, and a number of maximum power point tracking (MPPT) devices situated between the front-side cover and the back-side cover.

12 Claims, 5 Drawing Sheets

(56) References Cited

U.S. PATENT DOCUMENTS

| | | |
|---|---|---|
| 4,124,455 A | 11/1978 | Lindmayer |
| 4,193,975 A | 3/1980 | Kotval |
| 4,200,621 A | 4/1980 | Liaw |
| 4,213,798 A | 7/1980 | Williams |
| 4,251,285 A | 2/1981 | Yoldas |
| 4,284,490 A | 8/1981 | Weber |
| 4,315,096 A | 2/1982 | Tyan |
| 4,336,648 A | 6/1982 | Pschunder |
| 4,342,044 A | 7/1982 | Ovshinsky |
| 4,431,858 A | 2/1984 | Gonzalez |
| 4,514,579 A | 4/1985 | Hanak |
| 4,540,843 A | 9/1985 | Gochermann |
| 4,567,642 A | 2/1986 | Dilts |
| 4,571,448 A | 2/1986 | Barnett |
| 4,577,051 A | 3/1986 | Hartman |
| 4,586,988 A | 5/1986 | Nath |
| 4,589,191 A | 5/1986 | Green |
| 4,612,409 A | 9/1986 | Hamakawa |
| 4,617,421 A | 10/1986 | Nath |
| 4,633,033 A | 12/1986 | Nath |
| 4,652,693 A | 3/1987 | Bar-On |
| 4,657,060 A | 4/1987 | Kaucic |
| 4,667,060 A | 5/1987 | Spitzer |
| 4,670,096 A | 6/1987 | Schwirtlich |
| 4,694,115 A | 9/1987 | Lillington |
| 4,753,683 A | 6/1988 | Ellion |
| 4,771,017 A | 9/1988 | Tobin |
| 4,784,702 A | 11/1988 | Henri |
| 4,877,460 A | 10/1989 | Flodl |
| 4,933,061 A | 6/1990 | Kulkarni |
| 4,968,384 A | 11/1990 | Asano |
| 5,053,355 A | 10/1991 | von Campe |
| 5,075,763 A | 12/1991 | Spitzer |
| 5,084,107 A | 1/1992 | Deguchi |
| 5,118,361 A | 6/1992 | Fraas |
| 5,131,933 A | 7/1992 | Floedl |
| 5,178,685 A | 1/1993 | Borenstein |
| 5,181,968 A | 1/1993 | Nath |
| 5,213,628 A | 5/1993 | Noguchi |
| 5,217,539 A | 6/1993 | Fraas |
| 5,279,682 A | 1/1994 | Wald |
| 5,286,306 A | 2/1994 | Menezes |
| 5,364,518 A | 11/1994 | Hartig |
| 5,401,331 A | 3/1995 | Ciszek |
| 5,455,430 A | 10/1995 | Noguchi |
| 5,461,002 A | 10/1995 | Safir |
| 5,563,092 A | 10/1996 | Ohmi |
| 5,576,241 A | 11/1996 | Sakai |
| 5,627,081 A | 5/1997 | Tsuo |
| 5,676,766 A | 10/1997 | Probst |
| 5,681,402 A | 10/1997 | Ichinose |
| 5,698,451 A | 12/1997 | Hanoka |
| 5,705,828 A | 1/1998 | Noguchi |
| 5,726,065 A | 3/1998 | Szlufcik |
| 5,808,315 A | 9/1998 | Murakami |
| 5,814,195 A | 9/1998 | Lehan |
| 5,903,382 A | 5/1999 | Tench |
| 5,935,345 A | 8/1999 | Kuznicki |
| 6,034,322 A | 3/2000 | Pollard |
| 6,091,019 A | 7/2000 | Sakata |
| 6,140,570 A | 10/2000 | Kariya |
| 6,232,545 B1 | 5/2001 | Samaras |
| 6,303,853 B1 | 10/2001 | Fraas |
| 6,333,457 B1 | 12/2001 | Mulligan |
| 6,410,843 B1 | 6/2002 | Kishi |
| 6,441,297 B1 | 8/2002 | Keller |
| 6,468,828 B1 | 10/2002 | Glatfelter |
| 6,488,824 B1 | 12/2002 | Hollars |
| 6,538,193 B1 | 3/2003 | Fraas |
| 6,552,414 B1 | 4/2003 | Horzel |
| 6,586,270 B2 | 7/2003 | Tsuzuki |
| 6,620,645 B2 | 9/2003 | Chandra |
| 6,672,018 B2 | 1/2004 | Shingleton |
| 6,683,360 B1 | 1/2004 | Dierickx |
| 6,736,948 B2 | 5/2004 | Barrett |
| 6,803,513 B2 | 10/2004 | Beernink |
| 6,841,051 B2 | 1/2005 | Crowley |
| 7,030,413 B2 | 4/2006 | Nakamura |
| 7,164,150 B2 | 1/2007 | Terakawa |
| 7,328,534 B2 | 2/2008 | Dinwoodie |
| 7,388,146 B2 | 6/2008 | Fraas |
| 7,399,385 B2 | 7/2008 | German |
| 7,534,632 B2 | 5/2009 | Hu |
| 7,635,810 B2 | 12/2009 | Luch |
| 7,737,357 B2 | 6/2010 | Cousins |
| 7,749,883 B2 | 7/2010 | Meeus |
| 7,769,887 B1 | 8/2010 | Bhattacharyya |
| 7,772,484 B2 | 8/2010 | Li |
| 7,777,128 B2 | 8/2010 | Montello |
| 7,825,329 B2 | 11/2010 | Basol |
| 7,829,781 B2 | 11/2010 | Montello |
| 7,829,785 B2 | 11/2010 | Basol |
| 7,872,192 B1 | 1/2011 | Fraas |
| 7,905,995 B2 | 3/2011 | German |
| 7,977,220 B2 | 7/2011 | Sanjurjo |
| 8,070,925 B2 | 12/2011 | Hoffman |
| 8,115,093 B2 | 2/2012 | Gui |
| 8,152,536 B2 | 4/2012 | Scherer |
| 8,168,880 B2 | 5/2012 | Jacobs |
| 8,182,662 B2 | 5/2012 | Crowley |
| 8,196,360 B2 | 6/2012 | Metten |
| 8,209,920 B2 | 7/2012 | Krause |
| 8,222,513 B2 | 7/2012 | Luch |
| 8,222,516 B2 | 7/2012 | Cousins |
| 8,258,050 B2 | 9/2012 | Cho |
| 8,343,795 B2 | 1/2013 | Luo |
| 8,586,857 B2 | 11/2013 | Everson |
| 8,671,630 B2 | 3/2014 | Lena |
| 8,686,283 B2 | 4/2014 | Heng |
| 8,815,631 B2 | 8/2014 | Cousins |
| 9,029,181 B2 | 5/2015 | Rhodes |
| 9,147,788 B2 | 9/2015 | DeGroot |
| 9,287,431 B2 | 3/2016 | Mascarenhas |
| 2001/0008143 A1 | 7/2001 | Sasaoka |
| 2002/0015881 A1 | 2/2002 | Nakamura |
| 2002/0072207 A1 | 6/2002 | Andoh |
| 2002/0086456 A1 | 7/2002 | Cunningham |
| 2002/0176404 A1 | 11/2002 | Girard |
| 2002/0189939 A1 | 12/2002 | German |
| 2003/0000568 A1 | 1/2003 | Gonsiorawski |
| 2003/0000571 A1 | 1/2003 | Wakuda |
| 2003/0034062 A1 | 2/2003 | Stern |
| 2003/0042516 A1 | 3/2003 | Forbes |
| 2003/0070705 A1 | 4/2003 | Hayden |
| 2003/0097447 A1 | 5/2003 | Johnston |
| 2003/0116185 A1 | 6/2003 | Oswald |
| 2003/0121228 A1 | 7/2003 | Stoehr |
| 2003/0168578 A1 | 9/2003 | Taguchi |
| 2003/0183270 A1 | 10/2003 | Falk |
| 2003/0201007 A1 | 10/2003 | Fraas |
| 2004/0065363 A1 | 4/2004 | Fetzer |
| 2004/0103937 A1 | 6/2004 | Bilyalov |
| 2004/0112426 A1 | 6/2004 | Hagino |
| 2004/0123897 A1 | 7/2004 | Ojima |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan |
| 2005/0009319 A1 | 1/2005 | Abe |
| 2005/0012095 A1 | 1/2005 | Niira |
| 2005/0022861 A1 | 2/2005 | Rose |
| 2005/0061665 A1 | 3/2005 | Pavani |
| 2005/0064247 A1 | 3/2005 | Sane |
| 2005/0074954 A1 | 4/2005 | Yamanaka |
| 2005/0109388 A1 | 5/2005 | Murakami |
| 2005/0133084 A1 | 6/2005 | Joge |
| 2005/0178662 A1 | 8/2005 | Wurczinger |
| 2005/0189015 A1 | 9/2005 | Rohatgi |
| 2005/0199279 A1 | 9/2005 | Yoshimine |
| 2005/0252544 A1 | 11/2005 | Rohatgi |
| 2005/0257823 A1 | 11/2005 | Zwanenburg |
| 2006/0012000 A1 | 1/2006 | Estes |
| 2006/0060238 A1 | 3/2006 | Hacke |
| 2006/0060791 A1 | 3/2006 | Hazelton |

(56) References Cited

U.S. PATENT DOCUMENTS

| | | |
|---|---|---|
| 2006/0130891 A1 | 6/2006 | Carlson |
| 2006/0154389 A1 | 7/2006 | Doan |
| 2006/0213548 A1 | 9/2006 | Bachrach |
| 2006/0231803 A1 | 10/2006 | Wang |
| 2006/0255340 A1 | 11/2006 | Manivannan |
| 2006/0260673 A1 | 11/2006 | Takeyama |
| 2006/0272698 A1 | 12/2006 | Durvasula |
| 2006/0283496 A1 | 12/2006 | Okamoto |
| 2006/0283499 A1 | 12/2006 | Terakawa |
| 2007/0023081 A1 | 2/2007 | Johnson |
| 2007/0023082 A1 | 2/2007 | Manivannan |
| 2007/0108437 A1 | 5/2007 | Tavkhelidze |
| 2007/0110975 A1 | 5/2007 | Schneweis |
| 2007/0132034 A1 | 6/2007 | Curello |
| 2007/0137699 A1 | 6/2007 | Manivannan |
| 2007/0148336 A1 | 6/2007 | Bachrach |
| 2007/0186968 A1 | 8/2007 | Nakauchi |
| 2007/0186970 A1 | 8/2007 | Takahashi |
| 2007/0202029 A1 | 8/2007 | Burns |
| 2007/0235829 A1 | 10/2007 | Levine |
| 2007/0256728 A1 | 11/2007 | Cousins |
| 2007/0274504 A1 | 11/2007 | Maes |
| 2007/0283996 A1 | 12/2007 | Hachtmann |
| 2007/0283997 A1 | 12/2007 | Hachtmann |
| 2008/0000522 A1 | 1/2008 | Johnson |
| 2008/0041436 A1 | 2/2008 | Lau |
| 2008/0041437 A1 | 2/2008 | Yamaguchi |
| 2008/0047602 A1 | 2/2008 | Krasnov |
| 2008/0047604 A1 | 2/2008 | Korevaar |
| 2008/0053519 A1 | 3/2008 | Pearce |
| 2008/0061293 A1 | 3/2008 | Ribeyron |
| 2008/0092947 A1 | 4/2008 | Lopatin |
| 2008/0121272 A1* | 5/2008 | Besser et al. ............... 136/248 |
| 2008/0121276 A1 | 5/2008 | Lopatin |
| 2008/0121932 A1 | 5/2008 | Ranade |
| 2008/0128013 A1 | 6/2008 | Lopatin |
| 2008/0149161 A1 | 6/2008 | Nishida |
| 2008/0156370 A1 | 7/2008 | Abdallah |
| 2008/0173347 A1 | 7/2008 | Korevaar |
| 2008/0173350 A1 | 7/2008 | Choi |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness |
| 2008/0230122 A1 | 9/2008 | Terakawa |
| 2008/0251114 A1 | 10/2008 | Tanaka |
| 2008/0251117 A1 | 10/2008 | Schubert |
| 2008/0264477 A1 | 10/2008 | Moslehi |
| 2008/0276983 A1 | 11/2008 | Drake |
| 2008/0283115 A1* | 11/2008 | Fukawa et al. ............... 136/246 |
| 2008/0302030 A1 | 12/2008 | Stancel |
| 2008/0303503 A1* | 12/2008 | Wolfs ............................ 323/301 |
| 2008/0308145 A1 | 12/2008 | Krasnov |
| 2009/0007965 A1 | 1/2009 | Rohatgi |
| 2009/0056805 A1 | 3/2009 | Barnett |
| 2009/0078318 A1 | 3/2009 | Meyers |
| 2009/0084439 A1 | 4/2009 | Lu |
| 2009/0101872 A1 | 4/2009 | Young |
| 2009/0139512 A1 | 6/2009 | Lima |
| 2009/0151783 A1 | 6/2009 | Lu |
| 2009/0155028 A1 | 6/2009 | Boguslavskiy |
| 2009/0160259 A1* | 6/2009 | Naiknaware ........ H02M 7/4807 307/82 |
| 2009/0188561 A1 | 7/2009 | Aiken |
| 2009/0221111 A1 | 9/2009 | Frolov |
| 2009/0229854 A1 | 9/2009 | Fredenberg |
| 2009/0239331 A1 | 9/2009 | Xu |
| 2009/0250108 A1 | 10/2009 | Zhou |
| 2009/0255574 A1 | 10/2009 | Yu |
| 2009/0283138 A1 | 11/2009 | Lin |
| 2009/0283145 A1 | 11/2009 | Kim |
| 2009/0293948 A1 | 12/2009 | Tucci |
| 2009/0308439 A1 | 12/2009 | Adibi |
| 2009/0317934 A1 | 12/2009 | Scherff |
| 2009/0320897 A1 | 12/2009 | Shimomura |
| 2010/0006145 A1 | 1/2010 | Lee |
| 2010/0015756 A1 | 1/2010 | Weidman |
| 2010/0043863 A1 | 2/2010 | Wudu |
| 2010/0065111 A1 | 3/2010 | Fu |
| 2010/0068890 A1 | 3/2010 | Stockum |
| 2010/0084009 A1 | 4/2010 | Carlson |
| 2010/0087031 A1 | 4/2010 | Veschetti |
| 2010/0108134 A1 | 5/2010 | Ravi |
| 2010/0116325 A1* | 5/2010 | Nikoonahad ............... 136/251 |
| 2010/0124619 A1 | 5/2010 | Xu |
| 2010/0132774 A1 | 6/2010 | Borden |
| 2010/0132792 A1 | 6/2010 | Kim |
| 2010/0147364 A1 | 6/2010 | Gonzalez |
| 2010/0154869 A1 | 6/2010 | Oh |
| 2010/0169478 A1 | 7/2010 | Saha |
| 2010/0175743 A1 | 7/2010 | Gonzalez |
| 2010/0186802 A1 | 7/2010 | Borden |
| 2010/0193014 A1 | 8/2010 | Johnson |
| 2010/0218799 A1 | 9/2010 | Stefani |
| 2010/0224230 A1 | 9/2010 | Luch |
| 2010/0229914 A1 | 9/2010 | Adriani |
| 2010/0236612 A1 | 9/2010 | Khajehoddin |
| 2010/0240172 A1 | 9/2010 | Rana |
| 2010/0269904 A1 | 10/2010 | Cousins |
| 2010/0279492 A1 | 11/2010 | Yang |
| 2010/0300506 A1 | 12/2010 | Heng |
| 2010/0300507 A1 | 12/2010 | Heng |
| 2010/0313877 A1 | 12/2010 | Bellman |
| 2010/0326518 A1 | 12/2010 | Juso |
| 2011/0005569 A1 | 1/2011 | Sauar |
| 2011/0005920 A1 | 1/2011 | Ivanov |
| 2011/0073175 A1 | 3/2011 | Hilali |
| 2011/0088762 A1 | 4/2011 | Singh |
| 2011/0146759 A1 | 6/2011 | Lee |
| 2011/0146781 A1 | 6/2011 | Laudisio |
| 2011/0156188 A1 | 6/2011 | Tu |
| 2011/0168250 A1 | 7/2011 | Lin |
| 2011/0168261 A1 | 7/2011 | Welser |
| 2011/0186112 A1 | 8/2011 | Aernouts |
| 2011/0220182 A1 | 9/2011 | Lin |
| 2011/0245957 A1 | 10/2011 | Porthouse |
| 2011/0259419 A1 | 10/2011 | Hagemann |
| 2011/0272012 A1 | 11/2011 | Heng |
| 2011/0277688 A1 | 11/2011 | Trujillo |
| 2011/0277816 A1 | 11/2011 | Xu |
| 2011/0277825 A1 | 11/2011 | Fu et al. |
| 2011/0284064 A1 | 11/2011 | Engelhart |
| 2011/0297224 A1 | 12/2011 | Miyamoto |
| 2011/0297227 A1 | 12/2011 | Pysch |
| 2011/0308573 A1 | 12/2011 | Jaus |
| 2012/0000502 A1 | 1/2012 | Wiedeman |
| 2012/0012174 A1 | 1/2012 | Wu |
| 2012/0028461 A1 | 2/2012 | Ritchie |
| 2012/0031480 A1 | 2/2012 | Tisler |
| 2012/0040487 A1 | 2/2012 | Asthana |
| 2012/0073975 A1 | 3/2012 | Ganti |
| 2012/0080083 A1 | 4/2012 | Liang |
| 2012/0085384 A1 | 4/2012 | Beitel |
| 2012/0122262 A1 | 5/2012 | Kang |
| 2012/0125391 A1 | 5/2012 | Pinarbasi |
| 2012/0145233 A1 | 6/2012 | Syn |
| 2012/0152349 A1 | 6/2012 | Cao |
| 2012/0167986 A1 | 7/2012 | Meakin |
| 2012/0192932 A1 | 8/2012 | Wu |
| 2012/0240995 A1 | 9/2012 | Coakley |
| 2012/0248497 A1 | 10/2012 | Zhou |
| 2012/0279443 A1 | 11/2012 | Kornmeyer |
| 2012/0279548 A1 | 11/2012 | Munch |
| 2012/0285517 A1 | 11/2012 | Souza |
| 2012/0305060 A1 | 12/2012 | Fu et al. |
| 2012/0318319 A1 | 12/2012 | Pinarbasi |
| 2012/0318340 A1 | 12/2012 | Heng |
| 2012/0325282 A1 | 12/2012 | Snow |
| 2013/0000705 A1 | 1/2013 | Shappir |
| 2013/0014802 A1 | 1/2013 | Zimmerman |
| 2013/0056051 A1 | 3/2013 | Jin |
| 2013/0096710 A1 | 4/2013 | Pinarbasi |
| 2013/0112239 A1 | 5/2013 | Liptac |
| 2013/0130430 A1 | 5/2013 | Moslehi |

(56) References Cited

U.S. PATENT DOCUMENTS

| | | |
|---|---|---|
| 2013/0139878 A1 | 6/2013 | Bhatnagar |
| 2013/0152996 A1 | 6/2013 | DeGroot |
| 2013/0160826 A1 | 6/2013 | Beckerman |
| 2013/0174897 A1 | 7/2013 | You |
| 2013/0206213 A1 | 8/2013 | He |
| 2013/0206221 A1 | 8/2013 | Gannon |
| 2013/0213469 A1 | 8/2013 | Kramer |
| 2013/0220401 A1 | 8/2013 | Scheulov |
| 2013/0228221 A1 | 9/2013 | Moslehi |
| 2013/0247955 A1 | 9/2013 | Baba |
| 2013/0269771 A1 | 10/2013 | Cheun |
| 2013/0291743 A1 | 11/2013 | Endo |
| 2014/0000682 A1 | 1/2014 | Zhao |
| 2014/0053899 A1 | 2/2014 | Haag |
| 2014/0066265 A1 | 3/2014 | Oliver |
| 2014/0102524 A1 | 4/2014 | Xie |
| 2014/0124013 A1 | 5/2014 | Morad |
| 2014/0124014 A1 | 5/2014 | Morad |
| 2014/0154836 A1 | 6/2014 | Kim |
| 2014/0196768 A1 | 7/2014 | Heng |
| 2014/0242746 A1 | 8/2014 | Albadri |
| 2014/0318611 A1 | 10/2014 | Moslehi |
| 2014/0345674 A1 | 11/2014 | Yang |
| 2015/0007879 A1 | 1/2015 | Kwon |
| 2015/0020877 A1 | 1/2015 | Moslehi |
| 2015/0075599 A1 | 3/2015 | Yu |
| 2015/0090314 A1 | 4/2015 | Yang |
| 2015/0096613 A1 | 4/2015 | Tjahjono |
| 2015/0114444 A1 | 4/2015 | Lentine |
| 2015/0171230 A1 | 6/2015 | Kapur |
| 2015/0214409 A1 | 7/2015 | Pfeiffer |
| 2015/0270410 A1 | 9/2015 | Heng |
| 2015/0280641 A1 | 10/2015 | Garg |
| 2015/0349145 A1 | 12/2015 | Morad |
| 2015/0349153 A1 | 12/2015 | Morad |
| 2015/0349161 A1 | 12/2015 | Morad |
| 2015/0349162 A1 | 12/2015 | Morad |
| 2015/0349167 A1 | 12/2015 | Morad |
| 2015/0349168 A1 | 12/2015 | Morad |
| 2015/0349169 A1 | 12/2015 | Morad |
| 2015/0349170 A1 | 12/2015 | Morad |
| 2015/0349171 A1 | 12/2015 | Morad |
| 2015/0349172 A1 | 12/2015 | Morad |
| 2015/0349173 A1 | 12/2015 | Morad |
| 2015/0349174 A1 | 12/2015 | Morad |
| 2015/0349175 A1 | 12/2015 | Morad |
| 2015/0349176 A1 | 12/2015 | Morad |
| 2015/0349190 A1 | 12/2015 | Morad |
| 2015/0349193 A1 | 12/2015 | Morad |
| 2015/0349701 A1 | 12/2015 | Morad |
| 2015/0349702 A1 | 12/2015 | Morad |
| 2015/0349703 A1 | 12/2015 | Morad |
| 2016/0190354 A1 | 6/2016 | Agrawal |

FOREIGN PATENT DOCUMENTS

| | | |
|---|---|---|
| CN | 102263157 | 11/2011 |
| CN | 104409402 | 3/2015 |
| DE | 4030713 | 4/1992 |
| DE | 102006009194 | 8/2007 |
| DE | 202007002897 | 8/2008 |
| DE | 102010061317 | 6/2012 |
| DE | 10201201051 | 11/2013 |
| DE | 102012010151 | 11/2013 |
| EP | 1770791 | 4/2007 |
| EP | 1806684 | 8/2007 |
| EP | 2071635 | 6/2009 |
| EP | 2113946 | 11/2009 |
| EP | 2362430 | 8/2011 |
| EP | 2385561 A2 | 11/2011 |
| EP | 2479796 A1 | 7/2012 |
| EP | 2626907 A1 | 8/2013 |
| EP | 2479796 | 7/2015 |
| EP | 2626907 | 8/2015 |
| JP | H04245683 A | 9/1992 |
| JP | H07249788 A | 9/1995 |
| JP | 10004204 | 1/1998 |
| JP | H1131834 | 2/1999 |
| JP | 2000164902 | 6/2000 |
| JP | 2002057357 A | 2/2002 |
| JP | 2005159312 A | 6/2005 |
| JP | 2006324504 | 11/2006 |
| JP | 2008135655 | 6/2008 |
| JP | 2009054748 | 3/2009 |
| JP | 2009177225 | 8/2009 |
| JP | 2013526045 | 6/2013 |
| JP | 2013161855 | 8/2013 |
| JP | 2013536512 | 9/2013 |
| JP | 2013537000 | 9/2013 |
| JP | 2013219378 | 10/2013 |
| JP | 2013233553 | 11/2013 |
| JP | 2013239694 | 11/2013 |
| JP | 2013247231 | 12/2013 |
| KR | 20050122721 A | 12/2005 |
| KR | 20060003277 A | 1/2006 |
| KR | 20090011519 A | 2/2009 |
| WO | 9117839 | 11/1991 |
| WO | 9120097 A1 | 12/1991 |
| WO | 03083953 A1 | 10/2003 |
| WO | 2006097189 A1 | 9/2006 |
| WO | 2008089657 | 7/2008 |
| WO | 2009094578 | 7/2009 |
| WO | 2009150654 | 12/2009 |
| WO | 2009150654 A2 | 12/2009 |
| WO | 2010070015 | 6/2010 |
| WO | 2010075606 | 7/2010 |
| WO | 2010075606 A1 | 7/2010 |
| WO | 2010104726 A2 | 9/2010 |
| WO | 2010123974 | 10/2010 |
| WO | 2010123974 A1 | 10/2010 |
| WO | 2011005447 | 1/2011 |
| WO | 2011005447 A2 | 1/2011 |
| WO | 2011008881 | 1/2011 |
| WO | 2011008881 A2 | 1/2011 |
| WO | 2011053006 | 5/2011 |
| WO | 2011123646 A2 | 10/2011 |
| WO | 2013020590 | 2/2013 |
| WO | 2013020590 A1 | 2/2013 |
| WO | 2010085949 | 3/2013 |
| WO | 2013046351 | 4/2013 |
| WO | 2014074826 | 7/2014 |
| WO | 2014110520 | 7/2014 |
| WO | 2014117138 | 7/2014 |
| WO | 2015183827 | 12/2015 |
| WO | 2016090332 | 6/2016 |

OTHER PUBLICATIONS

CUI, 'Chapter 7 Dopant diffusion', publically available as early as Nov. 4, 2010 at <https://web.archive.org/web/20101104143332/http://ece.uwaterloo.ca/~bcui/content/NE/%20343/Chapter/%207%20Dopant%20 diffusion%20_%20I.pptx> and converted to PDF.

Davies, P.C.W., 'Quantum tunneling time,' Am. J. Phys. 73, Jan. 2005, pp. 23-27.

Green, Martin A. et al., 'High-Efficiency Silicon Solar Cells,' IEEE Transactions on Electron Devices, vol. ED-31, No. 5, May 1984, pp. 679-683.

Roedern, B. von, et al., 'Why is the Open-Circuit Voltage of Crystalline Si Solar Cells so Critically Dependent on Emitter-and Base-Doping?' Presented at the 9th Workshop on Crystalline Silicon Solar Cell Materials and Processes, Breckenridge, CO, Aug. 9-11, 1999.

Yao Wen-Jie et al: 'Interdisciplinary Physics and Related Areas of Science and Technology;The p recombination layer in tunnel junctions for micromorph tandem solar cells', Chinese Physics B, Chinese Physics B, Bristol GB, vol. 20, No. 7, Jul. 26, 2011 (Jul. 26, 2011), p. 78402, XP020207379, ISSN: 1674-1056, DOI: 10.1088/1674-1056-20/7/078402.

WP Leroy et al., "In Search for the Limits of Rotating Cylindrical Magnetron Sputtering", Magnetron, ION Processing and ARC Technologies European Conference, Jun. 18, 2010, pp. 1-32.

(56) References Cited

OTHER PUBLICATIONS

Beaucarne G et al: 'Epitaxial thin-film Si solar cells' Thin Solid Films, Elsevier-Sequoia S.A. Lausanne, CH LNKD- DOI:10.1016/J.TSF.2005.12.003, vol. 511-512, Jul. 26, 2006 (Jul. 26, 2006), pp. 533-542, XP025007243 ISSN: 0040-6090 [retrieved on Jul. 26, 2006].
Collins English Dictionary (Convex. (2000). In Collins English Dictionary. http://search.credoreference.com/content/entry/hcengdict/convex/0 on Oct. 18, 2014).
Dosaj V D et al: 'Single Crystal Silicon Ingot Pulled From Chemically-Upgraded Metallurgical-Grade Silicon' Conference Record of the IEEE Photovoltaic Specialists Conference, May 6, 1975 (May 6, 1975), pp. 275-279, XP001050345.
Hamm, Gary, Wei, Lingyum, Jacques, Dave, Development of a Plated Nickel Seed Layer for Front Side Metallization of Silicon Solar Cells, EU PVSEC Proceedings, Presented Sep. 2009.
JCS Pires, J Otubo, AFB Braga, PR Mei; The purification of metallurgical grade silicon by electron beam melting, J of Mats Process Tech 169 (2005) 16-20.
Khattak, C. P. et al., "Refining Molten Metallurgical Grade Silicon for use as Feedstock for Photovoltaic Applications", 16th E.C. Photovoltaic Solar Energy Conference, May 1-5, 2000, pp. 1282-1283.
Merriam-Webster online dictionary- "mesh". (accessed Oct. 8, 2012).
Mueller, Thomas, et al. "Application of wide-band gap hydrogenated amorphous silicon oxide layers to heterojunction solar cells for high quality passivation." Photovoltaic Specialists Conference, 2008. PVSC'08. 33rd IEEE. IEEE, 2008.
Mueller, Thomas, et al. "High quality passivation for heteroj unction solar cells by hydrogenated amorphous silicon suboxide films." Applied Physics Letters 92.3 (2008): 033504-033504.
Munzer, K.A. "High Throughput Industrial In-Line Boron BSF Diffusion" Jun. 2005. 20th European Photovoltaic Solar Energy Conference, pp. 777-780.
National Weather Service Weather Forecast Office ("Why Do We have Seasons?" http://www.crh.noaa.gov/lmk/?n=seasons Accessed Oct. 18, 2014).
O'Mara, W.C.; Herring, R.B.; Hunt L.P. (1990). Handbook of Semiconductor Silicon Technology. William Andrew Publishing/Noyes. pp. 275-293.
Stangl et al., Amorphous/Crystalline Silicon heterojunction solar cells—a simulation study; 17th European Photovoltaic Conference, Munich, Oct. 2001.
Warabisako T et al: 'Efficient Solar Cells From Metallurgical-Grade Silicon' Japanese Journal of Applied Physics, Japan Society of Applied Physics, JP, vol. 19, No. Suppl. 19-01, Jan. 1, 1980 (Jan. 1, 1980), pp. 539-544, XP008036363 ISSN: 0021-4922.
Hornbachner et al., "Cambered Photovoltaic Module and Method for its Manufacture" Jun. 17, 2009.
Machine translation of JP 10004204 A, Shindou et al.
Parthavi, "Doping by Diffusion and Implantation", <http://www.leb.eei.uni-erlangen.de/winterakademie/2010/report/course03/pdf/0306.pdf>.
Weiss, "Development of different copper seed layers with respect to the copper electroplating process," Microelectronic Engineering 50 (2000) 443-440, Mar. 15, 2000.
Tomasi, "Back-contacted Silicon Heterojunction Solar Cells With Efficiency>21%" 2014 IEEE.
Kanani, Nasser. Electroplating: Basic Principles, Processes and Practice, Chapter 8—"Coating Thickness and its Measurement," 2004, pp. 247-291.
P. Borden et al. "Polysilicon Tunnel Junctions as Alternates to Diffused Junctions" Proceedings of the 23rd European Photovoltaic Solar Energy Conference, Sep. 1, 2008-Sep. 5, 2008, pp. 1149-1152.
L. Korte et al. "Overview on a-Se:H/c heterojunction solar cells—physics and technology", Proceedings of the 22nd European Photovoltaic Solar Energy Conference, Sep. 3, 2007-Sep. 7, 2007, pp. 859-865.
Jianhua Zhao et al. "24% Efficient perl silicon solar cell: Recent improvements in high efficiency silicon cell research".
"Nonequilibrium boron doping effects in low-temperature epitaxial silicon" Meyerson et al., Appl. Phys. Lett. 50 (2), p. 113 (1987).
"Doping Diffusion and Implantation" Parthavi, <http://www.leb.eei.uni-erlangen.de/winterakademie/2010/report/content/course03/pdf/0306.pdf>.

\* cited by examiner

US 9,800,053 B2

SOLAR PANELS WITH INTEGRATED CELL-LEVEL MPPT DEVICES

RELATED APPLICATION

This application claims the benefit of U.S. Provisional Application No. 61/391,460, entitled "Method for Integrating Cell Level Maximum Power Point Tracker (MPPT) Devices with Solar Panels," by inventors Christopher James Beitel, Jiunn Benjamin Heng, Jianming Fu, and Zheng Xu, filed 8 Oct. 2010.

BACKGROUND

Field

This disclosure is generally related to solar panels. More specifically, this disclosure is related to a solar panel that is integrated with cell-level maximum power point tracker (MPPT) devices.

Related Art

A solar module/panel generally consists of individual solar cells that are electrically connected together in series. The serial connection of the solar cells increases the power and voltage output. For example, if n solar cells are connected in series, and are operating at exactly the same current and voltage, given that all of them have identical electrical characteristics and experience the same insolation and temperature, then the output voltage is n times that of an individual solar cell. However, one failed solar cell can significantly reduce the electricity generation of the entire module. In addition, power mismatch between electrically coupled solar cells can lead to drastic and disproportionate loss of power because the output current of the entire module is determined by the solar cell with the lowest output current. For example, when one solar cell is shaded while the remaining cells in the module are not, the power generated by the "good" cells can be dissipated by the shaded cell rather than powering the load. Shading of as little as 9% of a solar panel surface can lead to a system-wide power loss of as much as 54%. In some cases, the power mismatch can lead to a complete module failure (if safeguards like bypass diodes are not implemented).

Solar panel performance mismatch can be caused by a range of real-world phenomena, including partial shading caused by trees/handrails/chimney, bird droppings or debris, mismatch in cell/panel manufacture, lifetime degradation, differential aging/soiling, etc. Over time, the energy loss due to power mismatch among solar cells/modules can negatively impact the return on investment (ROI) of the solar array owner; weaken the economic rationale for solar power; and lead to installers and homeowners not utilizing roof space because of the shading and mismatch problems.

To overcome performance mismatch among solar cells within a module, a centralized form of performance optimization is carried out by an array solar inverter. Note that a large solar array often comprises individual solar panels that are connected in parallel. Typically, a series-connected set of solar cells or modules within a panel is called a "string," and a set of parallelly connected strings is called a "block." The array solar inverter receives DC current from each individual solar panel, and converts the DC current to AC. In addition, the solar inverter is configured to optimize the array's power generation by performing maximum power point tracking (MPPT) at the panel level.

SUMMARY

One embodiment of the present invention provides a solar cell panel that includes a front-side cover, a back-side cover, a number of solar cells situated between the front-side cover and the back-side cover, and a number of maximum power point tracking (MPPT) devices situated between the front-side cover and the back-side cover.

In a variation on the embodiment, a respective MPPT device is configured to control output power of a subset of solar cells.

In a variation on the embodiment, a respective MPPT device is configured to control output power of a single solar cell.

In a variation on the embodiment, a respective MPPT device includes an MPPT integrated circuit (IC) chip.

In a further variation, the MPPT IC chip is placed next to a corner of a corresponding solar cell.

In a further variation, the MPPT IC chip is placed under an edge of a corresponding solar cell and an edge of a solar cell adjacent to the corresponding solar cell.

In a further variation, the MPPT IC chip is electrically coupled to at least one solar cell using one of the following methods: solder bumps, flip-chip bonding, and contact wrap-through.

In a variation on the embodiment, a respective solar cell's busbar configuration is one of: a double-busbar configuration, a single center busbar configuration, and a single edge busbar configuration.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a solar module/panel capable of performing cell-level MPPT. To enable cell-level MPPT, each solar cell or group of cells within the module is electrically coupled to an MPPT device, which optimizes the power output of the solar cell or the group of cells. During the fabrication of the solar panel, the MPPT devices are placed adjacent to individual solar cells before inter-connected bus lines are formed and before encapsulation. Consequently, energy losses due to power mismatch among solar cells can be partially recouped.

Cell-Level MPPT

The serial connection of solar cells within a panel and parallel connections of panels in a solar array can lead to several problems. For example, if one series string experiences an open circuit, the corresponding parallel block will then have a lower current (and correspondingly lower power output) than the remaining blocks in the array. Similarly, in cases where bypass diodes are used, the voltage output of a string may be lowered when current is rerouted around under-performing cells.

A lowered output voltage from one panel leaves the solar inverter with two bad options: optimize the voltage for the under-performing panel or maximize the energy harvest from the unaffected panels. In most cases, the inverter chooses to maximize the energy output of the unaffected panels, which often causes the energy harvest of the impaired panel to drop to near zero.

In addition to mismatch losses (which are caused by the interconnected solar cells or modules not having identical properties or experiencing different conditions), another issue affecting maximum power capture from solar panels involves physically tracking the solar radiant. However, it is not economical to apply solar tracking to residential installation of solar panels. A fixed installation is effectively "shaded" most of the day when the incident angel of sun light is not minimized with respect to the solar panels. Moreover, ambient temperature (especially in tropical and semi-tropical regions) typically lowers the source voltage of the solar panels, thus affecting the overall power capacity of the solar panels.

Figure 1:
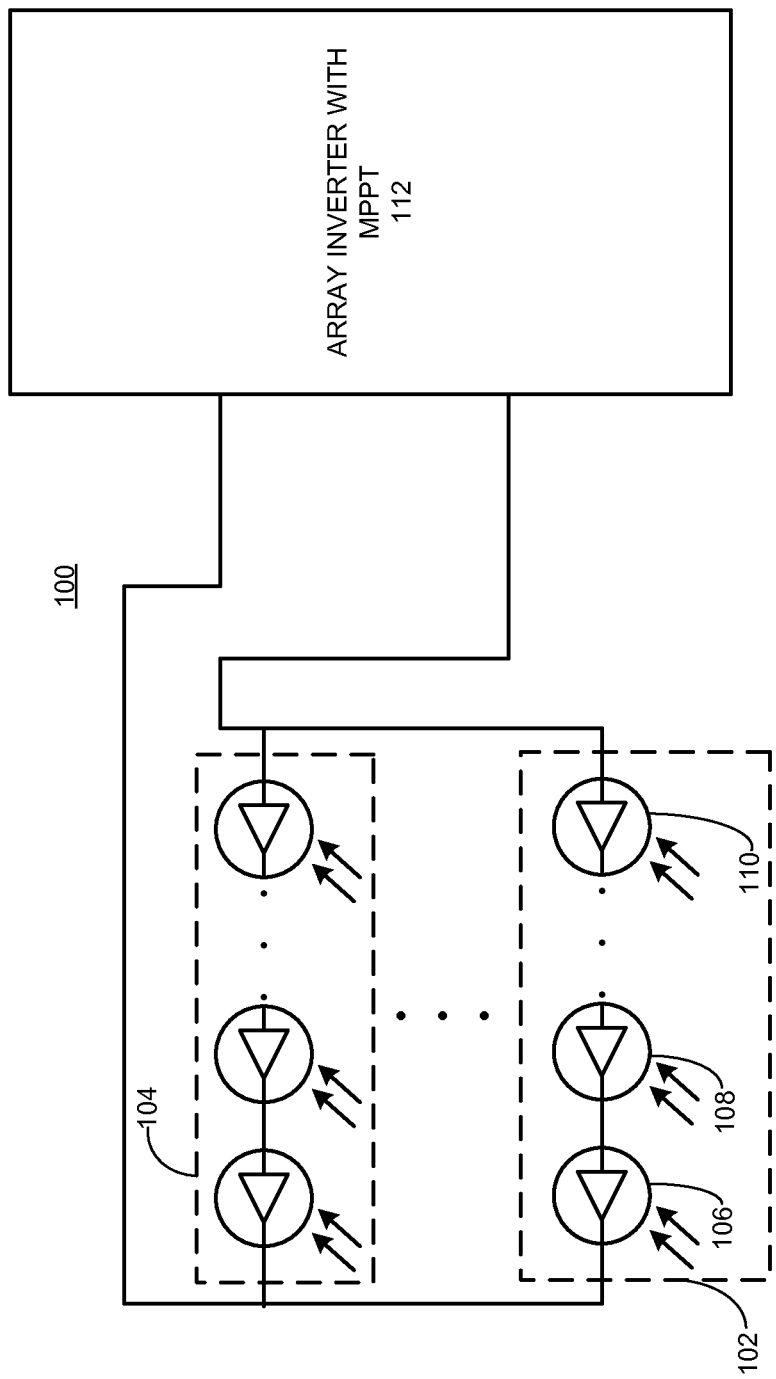
FIG. 1 presents a diagram illustrating the schematic of a conventional solar array (prior art).

To overcome these power losses, a "global" solution implementing panel-level MPPT has been commonly used. FIG. 1 presents a diagram illustrating the schematic of a conventional solar array (prior art). In FIG. 1, solar array 100 includes a number of solar panels, such as panels 102 and 104. Each solar panel includes a number of serially coupled solar cells. For example, solar panel 102 includes solar cells 106, 108, and 110, which are wired sequentially. The outputs of the solar panels are fed into an array inverter 112, which is configured to convert the DC output from each panel to AC and perform MPPT for each solar panel.

However, this solution only considers mismatch among panels without considering cell-to-cell mismatch within a solar panel. A better solution is to provide MPPT at the cell level in order to fully optimize solar panel performance by minimizing cell level mismatch resulting from various factors, such as uneven shading, debris, lifetime degradation, differential aging, and differential soiling.

Embodiments of the present invention use MPPT integrated circuit (IC) chips to manage power output of individual solar cells or groups of solar cells on a solar panel. Although the performance of individual cells may vary, the MPPT ICs ensure that each cell or cell group operates at the maximum power point, and the output current of each solar cell remains constant. Consequently, the solar cells on a string can all perform at the maximum power level, without their current being limited by the output of an impaired solar cell. Implementing cell-level MPPT allows a partially shaded or otherwise obscured panel to deliver the maximum capable power. This cell-level MPPT methodology can recoup up to around 30% of the energy loss resulting from mismatch. It also eliminates cell-binning requirements and may increase yield. Hence, this methodology can significantly enhance the ROI for the array owner by eliminating the need for installers' inventory management for matching panels within a string as well as reducing warranty reserves because replacement panels no longer need to be matched to the old system. Cell-level MPPT can also increase available surface area for the installation of a solar array, particularly in situations where there may be structural shading of the array at certain hours of the day or during certain seasons of the year.

Figure 2:
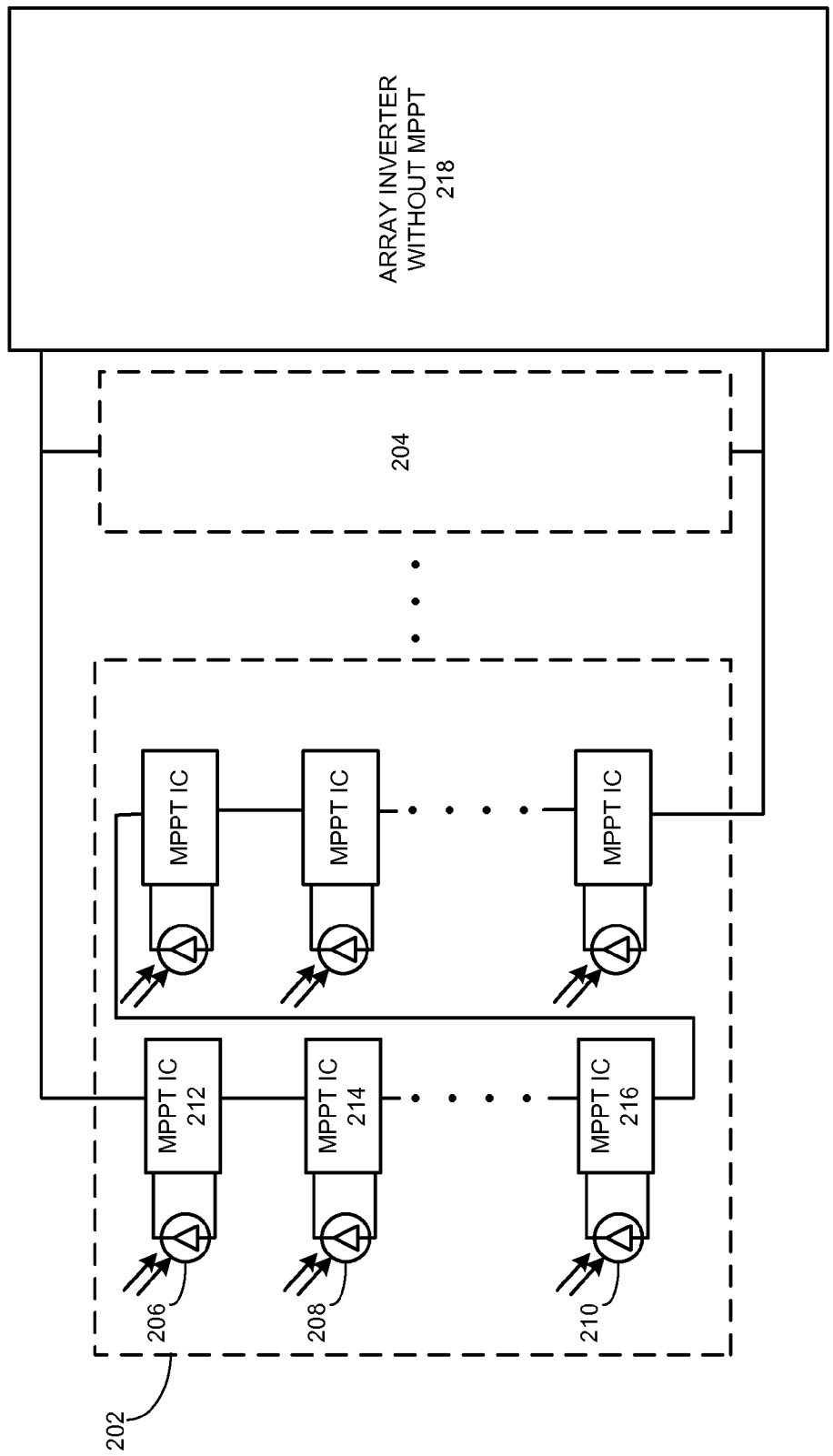
FIG. 2 presents a diagram illustrating the schematic of a solar array implementing cell-level maximum power point tracking (MPPT), in accordance with an embodiment of the present invention.

FIG. 2 presents a diagram illustrating the schematic of a solar array implementing cell-level maximum power point tracking (MPPT), in accordance with an embodiment of the present invention. Solar array 200 includes a number of solar panels, such as solar panels 202 and 204. Each solar panel includes a number of solar cells. For example, solar panel 202 includes solar cells 206, 208, and 210. Each solar cell is coupled to an MPPT IC chip, which performs MPPT on the coupled solar cell. For example, solar cell 206 is coupled to MPPT IC chip 212, which is configured to perform MPPT over solar cell 206. Similarly, solar cells 208 and 210 are coupled to MPPT IC chips 214 and 216, respectively. Note that each MPPT IC chip is configured to optimize the power output of the coupled solar cell independently, without receiving interference from other adjacent solar cells. For example, MPPT IC chip 212 optimizes the power output of solar cell 206 regardless of the performance of solar cells 208 and 210. The outputs of the solar panels are fed into an array inverter 218, which is configured to convert the DC current output from each panel to AC. Note that because each solar cell output has been optimized by the cell-level MPPT, in one embodiment, array inverter 218 does not have the MPPT functionality.

Figure 3:
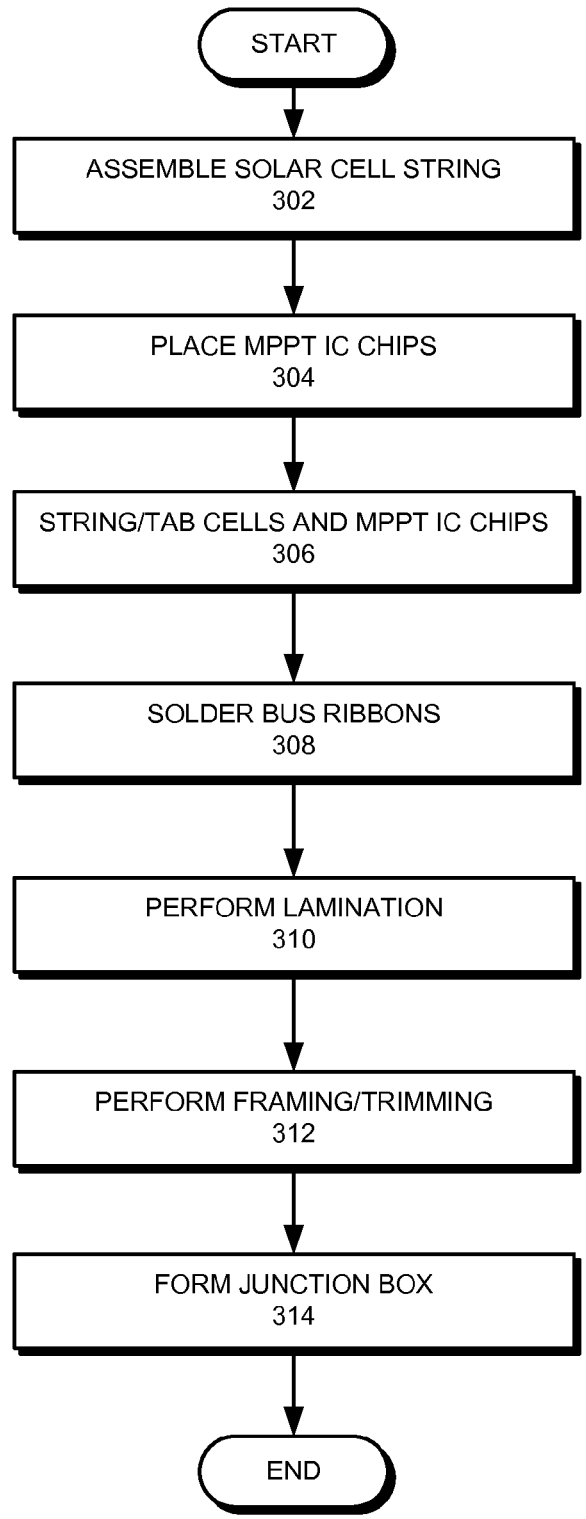
FIG. 3 presents a diagram illustrating the process of fabricating a solar panel with cell-level MPPT, in accordance with an embodiment of the present invention.

FIG. 3 presents a diagram illustrating the process of fabricating a solar panel with cell-level MPPT, in accordance with an embodiment of the present invention. During operation, a number of previously fabricated solar cells are assembled into a string using a conventional method (operation 302). Subsequently, MPPT IC chips are placed adjacent to the solar cells (operation 304). In one embodiment, the MPPT IC chips are placed at the corner spacing between adjacent solar cells. Such placement allows the MPPT IC chip manufacturers to fabricate chips with relatively large thickness, thus making the fabrication process relatively simpler. In another embodiment, the MPPT IC chips are placed beneath two adjacent solar cells. This scheme allows the IC chips to be protected from direct sunlight, and thus provides better reliability. Other placement schemes are also possible as long as they enable the electrical coupling between each solar cell and each MPPT IC chip.

Once the MPPT IC chips are put in place, a modified stringing/tabbing process is performed to ensure proper electrical connection between each solar cell and its corresponding MPPT IC chip, and between adjacent solar cell-MPPT IC units (operation 306). Note that the conventional stringing/tabbing process is used to interconnect solar cells by soldering leads (or tabs) to cell contacts in order to produce assembled solar cell strings. This modified stringing/tabbing process includes electrically coupling top electrode(s) to one terminal of the IC chips and bottoms electrode(s) to another terminal of the IC chips. Note that standard methods, such as solder bumps, flip-chip bonding, contact wrap-through, etc., can be used to electrically couple together the MPPT IC chips and the corresponding solar cells.

A typical MPPT IC chip is a three-terminal device, including two input terminals coupled to the corresponding solar cell and an output terminal coupled to the adjacent solar cell. Depending on how the MPPT IC chips are packaged or the locations of the terminals, electrical contacts can be made between solar cell electrodes and the MPPT IC chip terminals. In one embodiment, the top and bottom electrodes of a solar cell are coupled to the two input terminals of an MPPT IC chip, and the top or bottom electrode of the adjacent solar cell is coupled to the output of the MPPT IC chip. Note that the modified stringing/tabbing process results in a series connection for solar cells in a string similar to the solar cell string formed by a standard stringing process.

Subsequently, bus ribbons are soldered to the strings of solar cells and MPPT IC chips to form a completely interconnected module (operation 308), followed by a standard lamination process that seals the solar cells and the MPPT IC chips in place between a front-side cover (often made of glass) and a back-side cover (often made of a polymer, such as Tedlar®, registered trademark of DuPont of Wilmington, Del., U.S.) (operation 310). The lamination process protects the solar cells and the MPPT IC chips from damage caused by exposure to environmental factors. A standard framing/trimming process (operation 312) and formation of a junction box (operation 314) are performed to finish the manufacture of the solar panel.

Figure 4A:
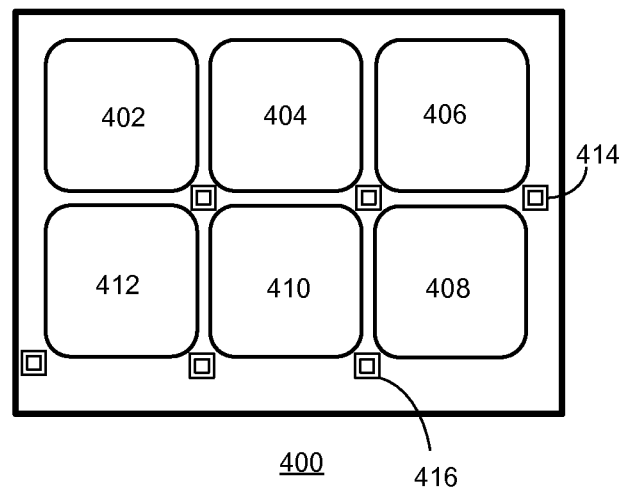
FIG. 4A presents a diagram illustrating one exemplary MPPT IC chip placement, in accordance with an embodiment of the present invention.

FIG. 4A presents a diagram illustrating one exemplary MPPT IC chip placement, in accordance with an embodiment of the present invention. In FIG. 4A, solar panel 400 includes six solar cells, solar cells 402, 404, 406, 408, 410, and 412. Each solar cell corresponds to an MPPT IC chip, which controls the power output of the solar cell and is placed at the lower right or left corner of the solar cell. For example, solar cell 406 corresponds to MPPT IC chip 414, which is placed at the lower right corner of solar cell 406; and solar cell 408 corresponds to MPPT IC chip 416, which is placed at the lower left corner of solar cell 408. Note that the two inputs of an MPPT IC chip are coupled to its corresponding solar cell, and the one output of the MPPT IC chip is coupled to an adjacent, serially connected solar cell. For example, the two inputs of MPPT IC chip 414 are coupled to the top and bottom electrodes of solar cell 406, and the output of MPPT IC chip 414 is coupled to either the top or the bottom electrode of solar cell 408. After the stringing/tabbing process, a series connection (402-404-406-408-410-412) is made. The wiring between the solar cells and the MPPT IC chips is not shown in FIG. 4A. This placement scheme has minimum impact on existing solar cell packaging scheme, because the MPPT IC chips are placed at locations that are previously unoccupied. In addition, this allows the manufacturer of the MPPT IC chips to have more leeway in the thickness of the IC chips. For example, the IC chip can be as thick as the solar cell.

Figure 4B:
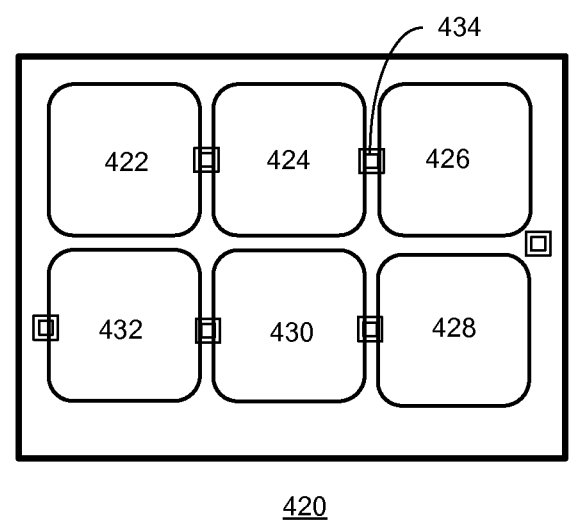
FIG. 4B presents a diagram illustrating one exemplary MPPT IC chip placement, in accordance with an embodiment of the present invention.

FIG. 4B presents a diagram illustrating one exemplary MPPT IC chip placement, in accordance with an embodiment of the present invention. In FIG. 4B, solar panel 420 includes six solar cells, solar cells 422, 424, 426, 428, 430, and 432. The MPPT IC chip that controls the output power of a solar cell is placed under the right edge of the solar cell. Note that although the MPPT IC chip is under two adjacent solar cells, it only controls the output power of the solar cell on one side. For example, the output power of solar cell 424 is controlled by MPPT IC chip 434, which is placed under the edges of solar cells 424 and 426. The two inputs of MPPT IC chip 434 are coupled to the top and bottom electrodes of solar cell 424, and the output of MPPT IC chip 434 is coupled to either the top or the bottom electrode of solar cell 426. The wiring between the solar cells and the MPPT IC chips is not shown in FIG. 4B. Because the MPPT IC chips are placed beneath the solar cells, they are protected from direct sunlight.

Figure 5:
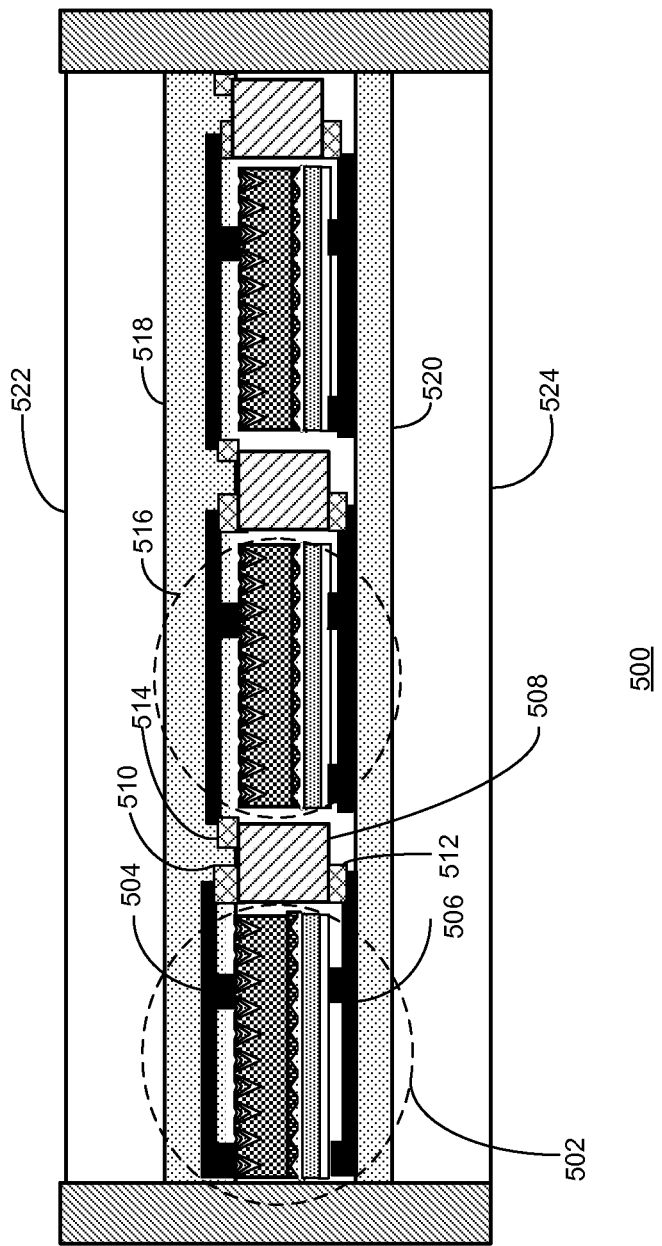
FIG. 5 presents a diagram illustrating the side view of a solar module implementing cell-level MPPT, in accordance with an embodiment of the present invention.

The wiring scheme between solar cells and MPPT IC chips varies depending on how the MPPT IC chips are packaged. In one embodiment, the input terminals of an MPPT IC chip are placed at the top and bottom sides of the chip and the output of the MPPT IC chip is placed at the top side of the chip. FIG. 5 presents a diagram illustrating the side view of a solar module implementing cell-level MPPT, in accordance with an embodiment of the present invention.

In FIG. 5, each solar cell in solar module 500 includes a top electrode and a bottom electrode. For example, solar cell 502 includes a top electrode 504 and a bottom electrode 506. Each MPPT IC chip includes a top input terminal, a bottom input terminal, and a top output terminal. For example, MPPT IC chip 508 includes a top input terminal 510, a bottom input terminal 512, and an output terminal 514. Top input terminal 510 and bottom input terminal 512 are coupled to top electrode 504 and bottom electrode 506, respectively. Output terminal 514 is coupled to an adjacent solar cell 516.

The solar cells and the MPPT IC chips are sandwiched between adhesive polymer layers 518 and 520, which can later be cured. Materials that can be used to form adhesive polymer layers 518 and 520 include, but are not limited to: ethylene-vinyl acetate (EVA), acrylic, polycarbonate, polyolefin, and thermal plastic. Solar module 500 further includes a front-side cover 522 and a back-side cover 524. Front-side cover 522 is usually made of glass and back-side cover 524 is usually made of a polymer, such as Tedlar®. When adhesive polymer layers 518 and 520 are cured, front- and back-side covers 522 and 524 are laminated, sealing the solar cells and the MPPT IC chips within, thus preventing damage caused by exposure to environmental factors.

Note that the detailed layer structure of the solar cells is not specified here because the solar cells can be of various types, including, but not limited to: monocrystalline and multicrystalline solar cells. In addition, the metallization patterns of the busbars on the solar cells include various configurations, such as one or two bus bars in the center, or a single edge bus bar.

The examples shown in FIGS. 4A, 4B, and 5 are for illustration purposes only and should not limit the scope of this disclosure. In general, embodiments of the present invention provide a novel solar panel that implements cell-level MPPT. In some embodiments, an MPPT device optimizes the output power of a single solar cell. In some embodiments, an MPPT device optimizes the output power of a group of solar cells, such as a solar cell string. In some embodiments, MPPT IC chips are integrated inside the solar panel before the front- and back-side covers are laminated. Placement of the MPPT IC chips shown in FIGS. 4A and 4B is merely exemplary; other placement schemes are also possible, as long as they enable electrical coupling between the solar cells and the MPPT IC chips. The packaged solar module shown in FIG. 5 is merely an example, and other types of packaging schemes are also possible.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A solar cell panel, comprising:
   a first cover on a first side of the solar panel;
   a second cover on a second side of the solar panel;
   a number of solar cells positioned between the first cover and the second cover, wherein a respective solar cell comprises a first electrode positioned on a first surface and a second electrode positioned on a second surface, and wherein the first and second surfaces are opposite to each other; and
   a maximum power point tracking integrated circuit chip positioned between a first solar cell and a nearest adjacent solar cell, wherein the maximum power point tracking integrated circuit chip is placed adjacent to an edge of the first solar cell and an edge of the nearest adjacent solar cell,
      wherein the maximum power point tracking integrated circuit chip includes a first input, a second input, and an output,
      wherein the first input, second input, and the output of the maximum power point tracking integrated circuit chip are physically separated from one another,
      wherein the first and second inputs are on opposite sides of the maximum power point tracking integrated circuit chip;
      wherein the first input is in direct contact with and substantially aligned in the same plan as the first electrode of the first solar cell,
      wherein the second input is in direct contact with and substantially aligned in the same plane as the second electrode of the first solar cell,
      wherein the output is in direct contact with the first electrode of the nearest adjacent solar cell, and
      wherein the maximum power point tracking integrated circuit chip provides a serial connection between the first solar cell and the nearest adjacent solar cell.

2. The solar panel of claim 1, wherein the maximum power point tracking integrated circuit chip is configured to control output power of a subset of solar cells.

3. The solar panel of claim 1, wherein the maximum power point tracking integrated circuit chip is configured to control output power of a single solar cell.

4. The solar panel of claim 1, wherein the maximum power point tracking integrated circuit chip is placed next to a corner of the first solar cell.

5. The solar panel of claim 1, wherein the maximum power point tracking integrated circuit chip is electrically coupled to the first solar cell and the nearest adjacent solar cell using one of the following methods:
   solder bumps;
   flip-chip bonding; and
   contact wrap-through.

6. The solar panel of claim 1, wherein a respective solar cell's busbar configuration is one of:
   a double-busbar configuration;
   a single center busbar configuration; and
   a single edge busbar configuration.

7. A solar cell coupling system, comprising:
   a first solar cell and a second solar cell, wherein each solar cell comprises a first electrode positioned on a first surface and a second electrode positioned on a second surface, and wherein the first and second surfaces are opposite to each other; and
   a maximum power point tracking integrated circuit chip positioned between the first solar cell and the second solar cell, wherein the maximum power point tracking integrated circuit chip is placed adjacent to an edge of the first solar cell and an edge of the nearest adjacent solar cell,
      wherein the maximum power point tracking integrated circuit chip includes a first input, a second input, and an output,
      wherein the first input, second input, and the output of the maximum power point tracking integrated circuit chip are physically separated from one another,
      wherein the first and second inputs are on opposite sides of the maximum power point tracking integrated circuit chip,
      wherein the first input is in direct contact with and substantially aligned in the same plane as the first electrode of the first solar cell,
      wherein the second input is in direct contact with and substantially aligned in the same plane as the second electrode of the first solar cell
      wherein the output is in direct contact with a first electrode of the second solar cell, and
      wherein the maximum power point tracking integrated circuit chip provides a serial connection between the first solar cell and the second solar cell.

8. The solar cell coupling system of claim 7, wherein the maximum power point tracking integrated circuit chip is configured to control output power of multiple solar cells.

9. The solar cell coupling system of claim 7, wherein the maximum power point tracking integrated circuit chip is dedicated to control output power of the first solar cell.

10. The solar cell coupling system of claim 7, wherein the maximum power point tracking integrated circuit chip is placed next to a corner of the first solar cell.

11. The solar cell coupling system of claim 7, wherein the maximum power point tracking integrated circuit chip is electrically coupled to the first solar cell and the second solar cell using one of the following methods:
   solder bumps;
   flip-chip bonding; and
   contact wrap-through.

12. The solar cell coupling system of claim 7, wherein a busbar configuration of the first and the second solar cells is one of:
   a double-busbar configuration;
   a single center busbar configuration; and
   a single edge busbar configuration.

* * * * *